United States Patent
Rowell

(10) Patent No.: US 11,835,559 B2
(45) Date of Patent: Dec. 5, 2023

(54) OVER-THE-AIR TEST SYSTEM AND METHOD OF PERFORMING AN OVER-THE-AIR MEASUREMENT

(71) Applicant: Rohde & Schwarz GmbH & Co. KG, Munich (DE)

(72) Inventor: Corbett Rowell, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 391 days.

(21) Appl. No.: 17/321,067

(22) Filed: May 14, 2021

(65) Prior Publication Data

US 2021/0389359 A1 Dec. 16, 2021

(30) Foreign Application Priority Data

Jun. 15, 2020 (EP) .................... 20179935

(51) Int. Cl.
| | | |
|---|---|---|
| *H04B 17/00* | (2015.01) | |
| *G01R 29/08* | (2006.01) | |
| *H01Q 13/02* | (2006.01) | |
| *H01Q 13/08* | (2006.01) | |
| *H01Q 19/10* | (2006.01) | |
| *H01Q 21/24* | (2006.01) | |

(52) U.S. Cl.
CPC ............ *G01R 29/08* (2013.01); *H01Q 13/02* (2013.01); *H01Q 13/085* (2013.01); *H01Q 19/10* (2013.01); *H01Q 21/24* (2013.01)

(58) Field of Classification Search
CPC ...... H04B 17/16; H04B 17/191; G01R 29/08; G01R 31/3025; G01R 31/31701; G01R 29/0878; H01Q 13/02; H01Q 19/10; H01Q 21/24
See application file for complete search history.

(56) References Cited

U.S. PATENT DOCUMENTS

| | | | |
|---|---|---|---|
| 10,958,361 B2* | 3/2021 | Maruo | ............... H04B 17/102 |
| 2019/0036621 A1* | 1/2019 | Vanwiggeren | ....... H04B 17/354 |
| 2019/0199002 A1 | 6/2019 | Rowell et al. | |
| 2020/0177289 A1 | 6/2020 | Maruo et al. | |
| 2021/0265742 A1* | 8/2021 | Lee | .......................... H04B 5/02 |

FOREIGN PATENT DOCUMENTS

| | | |
|---|---|---|
| EP | 3572821 A1 | 11/2019 |
| EP | 3584590 A1 | 12/2019 |
| JP | 2009147687 A | 7/2009 |
| WO | 2020074772 A1 | 4/2020 |

* cited by examiner

*Primary Examiner* — Tuan Pham
(74) *Attorney, Agent, or Firm* — CHRISTENSEN O'CONNOR JOHNSON KINDNESS PLLC

(57) ABSTRACT

An over-the-air test system for testing a device under test over-the-air is described. The over-the-air test system includes a reflector with a focal point, one center antenna and antenna elements. The center antenna is orientated towards the focal point of the reflector. The antenna elements are symmetrically located around the center antenna. An operational frequency range of the center antenna is different to an operational frequency range of the antenna elements. Further, a method of performing an over-the-air measurement of a device under test by using an over-the-air test system is described.

20 Claims, 2 Drawing Sheets

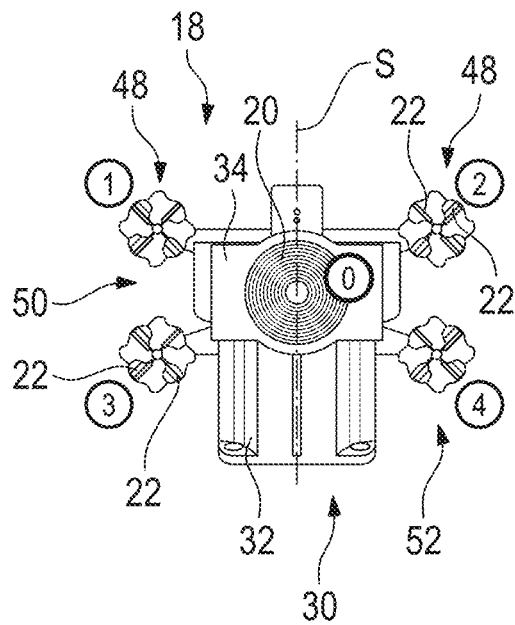
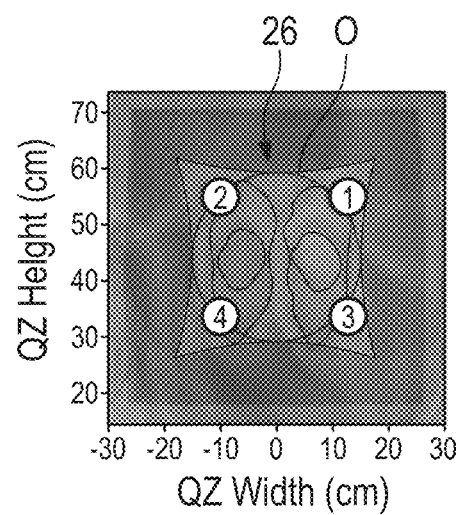
Fig. 3
Fig. 4
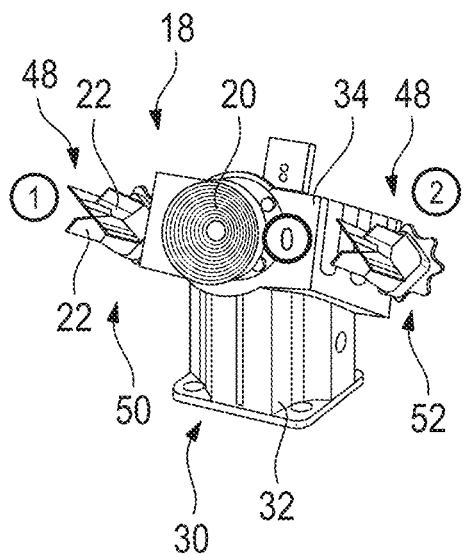
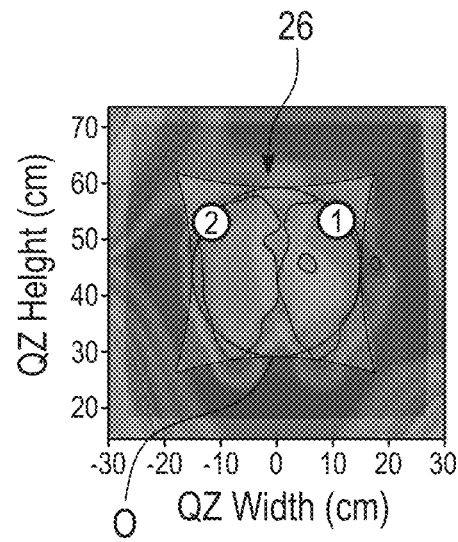
Fig. 5
Fig. 6

OVER-THE-AIR TEST SYSTEM AND METHOD OF PERFORMING AN OVER-THE-AIR MEASUREMENT

FIELD OF THE DISCLOSURE

Embodiments of the present disclosure generally relate to an over-the-air (OTA) test system for testing a device under test over-the-air. Embodiments of the present disclosure further relate to a method of performing an over-the-air measurement of a device under test by using an over-the-air test system.

BACKGROUND

Modern communication devices used for wireless communication, for instance base stations, mobile devices such as end devices, are typically tested with regard to their properties and/or characteristics by means of an over-the-air test system in a wireless manner During the respective measurements, the test systems perform in-band and out-of-band measurements of the device under test, particularly with regard to the transmission and/or reception properties of the device under test.

Typically, in-band measurements concern the main communication channel of the device under test, namely the defined telecommunications frequency band, whereas out-of-band measurements concern activities outside the respective frequency band.

In the state of the art, a feed switching device associated with a certain type of positioner is used in order to perform the different measurements. The feed switching device as well as the positioner together with the device under test are located in a test chamber of the test system, for instance a compact antenna test range (CATR). Several different techniques are known to position the respective antennas, also called feed antennas, for performing the respective measurements.

The most common technique known concerns a rotational positioner that is associated with several antennas placed around the positioner. However, the rotational positioner has to be quite large in order to ensure that scattering effects between the individual antennas are reduced. Alternatively, an additional shielding has to be placed between adjacent antennas, thereby reducing any scattering effects among these antennas. However, this results in additional costs for the shielding and higher testing efforts when setting up the respective test system.

Another technique concerns a linear positioner that is associated with the several antennas placed on a single section via which the antennas can be displaced in a linear manner. However, the linear positioner is disadvantageous due to space constraints within the test chamber.

Further techniques are known that however result in small quiet zones provided by the respective antennas at a test location of the device under test within the test chamber such that the measurement uncertainty is high.

Accordingly, there is a need for a cost-efficient and reliable test system that can be set up easily.

SUMMARY

Embodiments of the present disclosure provide an over-the-air test system for testing a device under test over-the-air. In an embodiment, the over-the-air test system comprises a reflector with a focal point, one center antenna and antenna elements. The center antenna is orientated towards the focal point of the reflector. The antenna elements are symmetrically located around the center antenna. An operational frequency range of the center antenna is different to an operational frequency range of the antenna elements.

Embodiments of the present disclosure further provide a method of performing an over-the-air measurement of a device under test by using an over-the-air test system, for example the over-the-air test system mentioned above. In an embodiment, the method comprises the steps of:

providing an over-the-air test system that comprises a reflector with a focal point, one center antenna and antenna elements, wherein the center antenna is orientated towards the focal point of the reflector;

generating a main quiet zone by means of the center antenna using a first operational frequency range; and generating at least one quiet zone by means of the antenna elements using a second operational frequency range, wherein the second operational frequency range is different to the first operational frequency range of the center antenna.

Accordingly, the over-the-air test system comprises antennas, namely the center antenna as well as the several antenna elements, which are operated differently due to the different operational frequency ranges. Since the center antenna and the antenna elements have different operational frequency ranges, different feeds can be provided.

The center antenna may correspond to an in-band antenna, whereas the antenna elements relate to out-of-band antennas. Hence, the in-band antenna is orientated towards the focal point of the reflector, whereas the several antenna elements are located offset with respect to the center antenna.

The several antenna elements are associated with an array of offset antenna elements, which is formed around the center antenna orientated towards the focal point of the reflector.

Even though the antenna elements are offset with regard to the center antenna, the antenna elements are located and/or orientated in a pre-defined manner. Accordingly, the antenna elements establish the respective array.

In some embodiments, the antenna elements are symmetrically arranged around the center antenna, resulting in each of the antenna elements being distanced from a center of the center antenna by the same radius. Accordingly, the array associated with the different antenna elements relates to a semi-circle at least.

Generally, the different operational frequency ranges, namely the ones associated with the center antenna and the antenna elements, mean that the operational frequency ranges differ in at least one boundary of the respective operational ranges.

Accordingly, the different operational frequency ranges may intersect each other, for instance (only) at a common boundary frequency or over a certain frequency sub-range that encompasses more than a single frequency.

Further, the larger operational frequency range may encompass the smaller operational frequency range completely such that the smaller operational frequency range is a subset of the larger one.

Moreover, the different operational frequency ranges may be offset with respect to each other completely. This means that the different operational frequency ranges do not intersect with each other. In other words, they do not even have a single frequency in common.

However, the different operational frequency ranges may be offset with respect to each other while having intersecting each other only at a single frequency, namely the common boundary frequency.

Hence, the lower boundary of the first operational frequency range may be equal/higher than an upper boundary of the second operational frequency range that is generally associated with a lower frequency range compared to the first operational frequency range. Alternatively, the upper boundary of the first operational frequency range may be equal/lower than a lower boundary of the second operational frequency range that is generally associated with a higher frequency range compared to the first operational frequency range.

For example, a smaller operational frequency range, for instance the first one, is associated with a frequency range from 24 to 43 GHZ, whereas a larger operational frequency range, for instance the second one, may be associated with a frequency range from 6 to 90 GHz. This results in the embodiment in which the larger operational frequency range encompasses the smaller one completely. Therefore, the smaller frequency range is a subset of the larger one.

However, the second operational frequency range may also be associated with a frequency range from 43 to 90 GHz, whereas the first operational frequency range may be associated with a frequency range from 24 to 43 GHz. Hence, the different operational frequency ranges are offset with respect to each other while having a common boundary, namely the single frequency of 43 GHz.

The second operational frequency range may also be assigned to a frequency range from 6 to 24 GHz, whereas the first one is assigned to a frequency range from 24 to 43 GHz, yielding in two operational frequency ranges that are offset with respect to each other while having a common boundary at the single frequency of 24 GHz. In other words, they intersect each other at the single frequency of 24 GHz only.

Alternatively, the second operational frequency range may be associated with a frequency range from 6 to 30 GHz, whereas the first operational frequency range ranges from 24 to 43 GHz, resulting in two operational frequency ranges that intersect each other. In other words, the different operational frequency ranges coincide with each other partly, namely by the frequency subrange from 24 to 30 GHz.

Moreover, the second operational frequency range may also be assigned to a frequency range from 6 to 20 GHz, whereas the first one is assigned to a frequency range from 24 to 43 GHz, yielding in two operational frequency ranges that are offset with respect to each other completely since they do not have a single frequency in common.

The above-mentioned different examples illustrate how the different operational frequency ranges may differ, resulting in the operational frequency ranges that are different. The examples clearly show that the different operational frequency ranges differ in at least one boundary as discussed above.

Generally, the different operational frequency ranges may have an influence on quiet zones generated by the respective antennas, namely the center antenna and the several antenna elements.

Hence, differently sized quiet zones may be provided by the center antenna and the individual antenna elements.

In other words, the center antenna may generate the main quiet zone that is differently sized with respect to the at least one quiet zone generated by the antenna elements, for example the individual or rather separate quiet zones generated by the antenna elements individually.

An aspect provides that the operational frequency range of the center antenna is either a subset of the operational frequency range of the antenna elements or the operational frequency range of the center antenna relates to a different frequency band compared with the antenna elements. As discussed above, different test scenarios can be applied for testing the device under test in an appropriate manner.

In some embodiments, the antenna elements can be controlled in such a manner that the operational frequency range relates to a different frequency band compared with the center antenna. This can be done in a certain test scenario. Hence, the operational frequency range of the antenna elements can be adapted during the respective testing of the device under test.

Alternatively, the operational frequency range of the center antenna may be associated with a subset of the operational frequency range of the antenna elements. Again, this depends on the test scenario applied since at least the antenna elements are controlled appropriately such that the operational frequency range of the antenna elements is so large that it can encompass the one of the center antenna completely.

Another aspect provides that the antenna elements are grouped in at least two different antenna groups, wherein each antenna group, in a front view on the center antenna, is assigned to one side of the center antenna. Thus, at least two different antenna groups are provided that are located laterally displaced with respect to the center antenna.

In some embodiments, the at least two antenna groups are located in a symmetrical manner with respect to a vertical symmetry axis of the center antenna. Hence, a first antenna group associated with a first lateral side and a second antenna group associated with the second lateral side are provided, wherein the second lateral side is opposite to the first lateral side with regard to the vertical symmetry axis. The front side of the center antenna is associated with the aperture of the center antenna. Put differently, the center antenna receives and/or emits electromagnetic signals via its front side.

Moreover, the antenna elements may be located and/or orientated such that the antenna elements each generate a respective quiet zone, wherein the respective quiet zone is (mostly) located within a main quiet zone generated by the center antenna. The main quiet zone is associated with a test location for the device under test at which the device under test is placed during the testing. The antenna elements are located and/or orientated in a pre-defined manner such that the quiet zones provided by these antenna elements are located within the main quiet zone provided by the center antenna. In other words, the quiet zones are (substantially) located inside the main quiet zone. Hence, the respective quiet zones provided by the individual antenna elements are also associated with the test location, namely the device under test placed on the test location.

In the context of the present disclosure, the term "mostly/substantially" located within the main quiet zone means that minor deviations from being located completely in the main quiet zone may occur due to tolerances.

In some embodiments, the quiet zones generated by the antenna elements together cover a combined space that (substantially) equals the space of the main quiet zone generated by the center antenna. In some embodiments, the quiet zones generated by the antenna elements are located adjacent to each other, thereby establishing a combined quiet zone associated with the combined space. The combined space (substantially) equals the space of the main quiet zone that is generated by the center antenna. The space of the respective quiet zone corresponds to its size. Accordingly, the antenna elements are located and/or orientated such that the respective quiet zones generated together fill up the space provided by the main quiet zone.

Again, in the context of the present disclosure the term "substantially" equals the space of the main quiet zone means that minor deviations from equaling absolutely may occur due to tolerances.

According to an aspect, the center antenna and the antenna elements are different from each other. The antenna elements and the center antenna are associated with different operational frequency ranges such that their designs may be adapted to the respective operational frequency range.

In some embodiments, the antenna elements are each identical and/or the center antenna is a horn antenna. All of the antenna elements provided are established identically, whereas the center antenna is established by a horn antenna.

The center antenna may be a narrowband antenna. Alternatively or additionally, the antenna elements are wideband antennas that each have a bandwidth larger than the center antenna. In some embodiments, the center antenna has a frequency range from 24 to 43 GHz. As discussed above, the antenna elements and the center antenna have different operational frequency ranges. Therefore, they can be used to test different frequency bands. Since the antenna elements are wideband antennas, they can be used for covering different frequency bands during the testing of the device under test, for example the out-of-band testing. The center antenna may be used to perform the in-band testing of the device under test.

For instance, the antenna elements are established by Vivaldi antennas. The Vivaldi antennas are also called tapered slot antennas. In some embodiments, the Vivaldi antenna relates to a co-planar broadband/wideband antenna made from a solid piece of sheet metal, a printed circuit board, or from a dielectric plate metalized on one or both sides. Hence, the antenna elements can be manufactured in a cost-efficient manner, thereby reducing the overall costs of the test system. Further, the Vivaldi antennas are lightweight antennas such that these antennas can be used in an efficient manner.

In some embodiments, two antenna elements are orientated perpendicularly with respect to each other, thereby establishing a dual-polarized antenna unit. The dual-polarized antenna unit is also called X-shaped Vivaldi antenna or rather X-band antenna.

The over-the-air test system may have an antenna device that comprises the center antenna and the antenna elements. The antenna device has a main body to which the center antenna is connected. The antenna elements are located at arms that extend away from the main body. A compact design of the over-the-air test system can be ensured in this way since the respective antennas, namely the center antenna and the antenna elements, are provided by a single device, namely the antenna device. The antenna device ensures that the antenna elements are located and/or orientated with respect to the center antenna in a pre-defined manner. This further ensures that the antenna elements cannot be moved with respect to the center antenna in an unintended manner. Moreover, the antenna elements cannot be moved among each other in an unintended manner.

Further, the main body may be configured to be tilted with respect to a horizontal plane such that the main body is enabled to adjust elevation. The elevation corresponds to the respective elevation angle. Further, the main body may comprise at least two parts moveable with respect to each other, thereby ensuring the adjustment of elevation. Accordingly, the entire antenna device may be aligned or rather adjusted with respect to the reflector, for example its focal point, in an easy and efficient manner by simply moving the main body in the desired manner, for example by tilting the main body with respect to the horizontal plane.

The respective adjustment or rather alignment may be done in a controlled manner. Accordingly, an electrical control signal may be provided that is used to align or rather set the main body in the desired orientation, thereby ensuring that the antenna elements and/or the center antenna are/is orientated appropriately.

According to another embodiment, each arm provided may be associated with at least one corresponding cable guide that guides a cable to the antenna element provided at the respective arm, wherein the cable guides each comprise a curved section providing a curvature for the cable and/or a hole in the cable guide, wherein the hole is located between the curved section and an attachment point at which the cable guide is attached to the arm. The curved section of the cable guide ensures that the cables used for signal transmission are not stressed when guided to the respective antenna element, thereby ensuring best transmission properties. The respective hole provided in the cable guide ensures that the entire antenna device is a lightweight one. Furthermore, a bending of the cable guides can be prevented due to the lightweight design of the cable guides due to the reduced tare weight of the cable guides. In addition, the cable guide may be swivably attached to the main body such that the cable guides can be swiveled with respect to the main body. Accordingly, the entire antenna device can be compacted by simply swiveling the cable guides with respect to the main body, thereby achieving a compact state. The compact state may be used for transport purposes of the antenna device.

Furthermore, the over-the-air test system may comprise a test chamber that encompasses a test location for the device under test and/or a signal generation and/or analysis equipment. The signal generation and/or analysis equipment may be connected with the antennas, namely the center antenna as well as the antenna elements. Accordingly, quiet zones may be generated by the antennas due to signals forwarded to the respective antennas, which have been generated by the signal generation and/or analysis equipment. Furthermore, signals received by the respective antennas can be combined by the signal generation and/or analysis equipment, for instance in radio frequency or in baseband, for analyzing purposes.

The test chamber encompassing the test location for the device under test ensures that the entire over-the-air test system may concern a compact antenna test range (CATR). Thus, the respective over-the-air properties and/or characteristics of the device under test can be investigated in a compact space that is limited by the test chamber.

Generally, the respective reflector reflects impinging electromagnetic waves such that far-field characteristics/properties of the device under test can be tested even though the test chamber is a compact one.

The antenna elements may be controlled such that a sequential measurement or a combined measurement is performed. Thus, different test scenarios can be performed in order to test the properties and/or characteristics of the device under test. For instance, the quiet zones provided may be superposed in a certain manner depending on the measurement performed, namely a sequential one or a combined one. In the combined measurement, all antenna elements are controlled such that they generate quiet zones simultaneously. In an alternative testing, namely the sequential testing, the antenna elements are controlled such that they generated (different) quiet zones in a subsequent manner.

For instance, separate quiet zones are generated by the antenna elements, wherein one of the separate quiet zones has a higher power than at least one other of the separate quiet zones when performing the combined measurement. Hence, different test scenarios may be used for testing purposes.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 3 shows a schematic front view on the antenna device shown in FIG. 2;

FIG. 4 shows an overview illustrating the different quiet zones provided by the antennas of the antenna device shown in FIGS. 2 and 3;

FIG. 5 shows a perspective view of another example antenna device that can be used in the over-the-air test system according to the present disclosure; and FIG. 6 shows an overview of the quiet zones provided by the antenna device shown in FIG. 5.

DETAILED DESCRIPTION

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
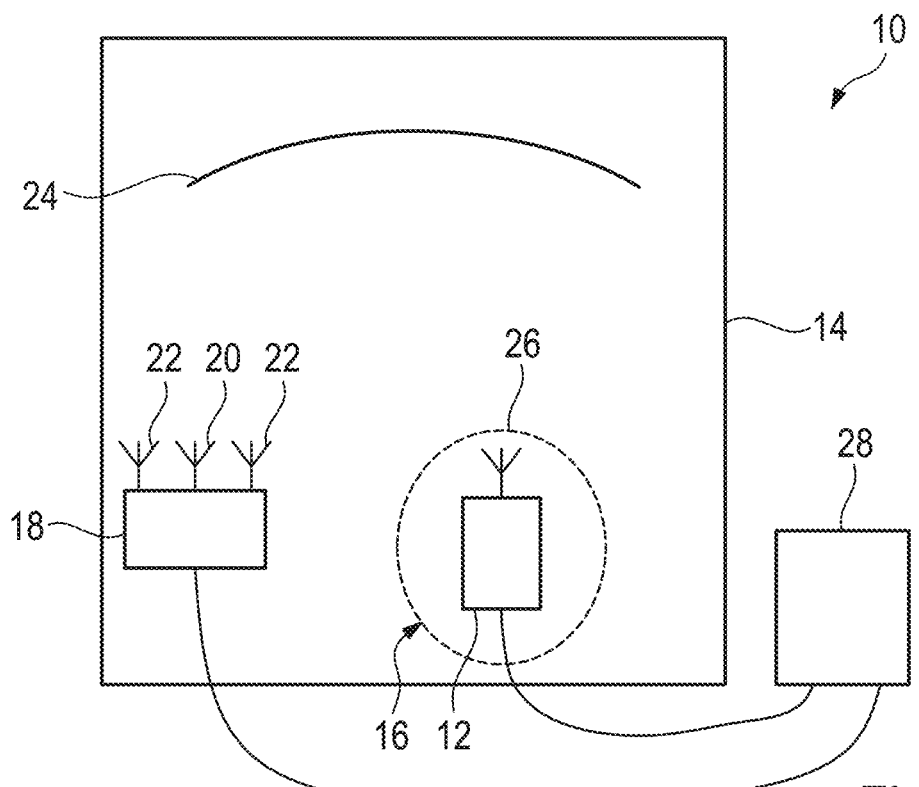
FIG. 1 schematically shows an overview of an over-the-air test system according to an embodiment of the present disclosure.

In FIG. 1, an example over-the-air test system 10 for testing a device under test 12 over-the-air is shown. The over-the-air test system 10 comprises a test chamber 14 that may be established by a shielded chamber and/or an anechoic chamber. The test chamber 14 encompasses a test location 16 at which the device under test 12 is located for testing purposes.

Figure 2:
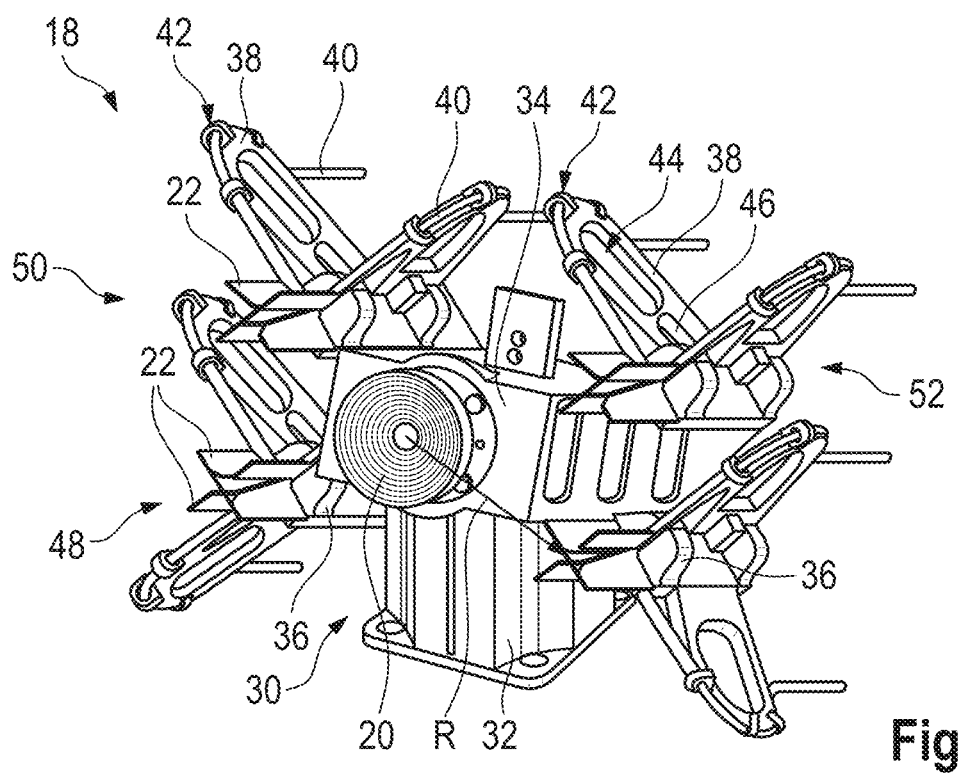
FIG. 2 shows a perspective view of an example antenna device that can be used in an over-the-air test system according to the present disclosure.

The over-the-air test system 10 also comprises an antenna device 18 that is shown in FIG. 1 schematically and in a more detail in FIG. 2. In the embodiment shown, the antenna device 18 comprises a center antenna 20 as well as several antenna elements 22 that are symmetrically located around the center antenna 20 as will be described later with reference to FIG. 2.

The over-the-air test system 10 further comprises a reflector 24 that is located within the test chamber 14, wherein the antenna device 18 is orientated towards the reflector 24. Accordingly, electromagnetic waves transmitted by the antennas of the antenna device 18, namely the center antenna 20 and the antenna elements 22, propagate towards the reflector 24 that reflects the impinging electromagnetic waves/signals towards the test location 16 such that the device under test 12 receives these waves.

The electromagnetic waves provided by the antennas generate at least one quiet zone 26 at the test location 16 such that the device under test 12 is located within the quiet zone 26. The respective quiet zone 26 may be a superimposed one that is obtained by the sum of several different quiet zones that are generated by the antennas individually. In FIG. 1, the (superimposed) quiet zone 26 to which the device under test 12 located at the at the test location 16 is exposed is illustrated by dashed lines in FIG. 1.

The over-the-air test system 10 also comprises a signal generation and/or analysis equipment 28 that is connected with the antenna device 18 and/or the device under test 12 in a signal-transmitting manner such that control signals and/or received signal may be forwarded from and/or to the signal generation and/or analysis equipment 28 appropriately. In some embodiments, the signal generation and/or analysis equipment 28 includes circuitry configured to carry out its functionality described herein.

In general, the center antenna 20 as well as the antenna elements 22 each have an individual operational frequency range wherein the operational frequency ranges differ with respect to each other. Accordingly, the operational frequency ranges associated with the center antenna 20 and the antenna elements 22 differ in at least one boundary of the respective frequency ranges.

This means that the operational frequency ranges may intersect each other and/or that a larger one may encompass a smaller one (at least partly). The operational frequency ranges may have a common boundary frequency, for example a single one. Alternatively, the different operational frequency ranges may be offset with respect to each other. Hence, they do not intersect each other.

The different scenarios concerning the different operational frequency ranges may be obtained during different test steps in a single test scenario or rather in different test scenarios. Accordingly, the antenna elements 22 and/or the center antenna 20 may be controlled by the signal generation and/or analysis equipment 28 accordingly such that the respective operational frequency range is set.

The antenna device 18 is shown in more detail in FIG. 2. As shown in FIG. 2, the antenna device 18 has a main body 30 that comprises a first part 32 and a second part 34 that can be moved with respect to each other, thereby ensuring a tilting movement of the antenna device 18 with respect to a horizontal plane (below in FIG. 2). In some embodiments, the antenna device 18 is (fixedly) connected via its first part 32 such that the second part 34 can be moved with respect to the first part 32, thereby ensuring the tilting movement of the main body 30 and the antennas connected therewith.

Generally, the center antenna 20, established by a horn antenna in the shown embodiment, is connected to the main body 30, for example the second part 34 of the main body 30.

In the shown embodiment, the antenna elements 22 are connected to arms 36 of the antenna device 18 that extend from the main body 30 laterally. The respective arms 36 ensure that the antenna elements 22 are located and/or orientated with respect to the center antenna 20 in a defined manner. In some embodiments, the individual antenna elements 22 are located on a circle that surrounds the center antenna 20 by a radius R as indicated in FIG. 2.

Furthermore, cable guides 38 may be provided that guide cables 40 connected to the individual antenna elements 22 such that signals can be forwarded to the antenna elements 22 or rather signals received by the antenna elements 22 can be forwarded to the signal generation and/or analysis equipment 28 by the cables 40. The respective cable guides 38 each provide a curved section 42 for the cables 40 such that the cables 40 are not bent or rather stressed when being guided to the antenna elements 22.

In addition, the cable guides 38 each comprise a hole 44 that is located between the curved section 42 and an attachment point 46 at which the cable guide 38 is connected to the respective arm 36. The respective attachment points 46 may be configured to provide a swiveling functionality of the cable guides 38 with respect to the arms 36 such that the cable guides 38 can be swiveled into a compact transportation state of the antenna device 18.

In the shown embodiment, the antenna elements 22 are established by Vivaldi antennas, also called tapered slot antennas. In some embodiments, the antenna elements 22 are each identical.

In the shown embodiment, the individual antenna elements 22 are orientated such that two antenna elements 22 located at the same arm 36 are perpendicular with respect to each other, thereby intersecting each other in a perpendicular manner in order to establish X-band antenna units 48 at each arm 36. The X-band antenna units 48 are also called dual-polarized antenna units 48.

Generally, the center antenna 20, namely the horn antenna, as well as the antenna elements 22 relate to an in-band antenna and out-of-band antennas, respectively. Put differently, the center antenna 20 and the antenna elements 22 are different from each other.

In some embodiments, the center antenna 20 is a narrow band antenna, for instance having a frequency range from 24 to 43 GHz, whereas the antenna elements 22 are broadband/wideband antennas that each have a bandwidth that is larger than the center antenna 20, for instance from 6 to 90 GHz.

In general, the center antenna 20 is orientated towards the focal point of the reflector 24 in the over-the-air test system 10 such that the center antenna 20 provides a main quiet zone at the test location 16 having a certain size. This becomes clear when referring to FIGS. 3 and 4.

FIG. 3 shows the antenna device 18 of FIG. 2 in a front view (without cable guides 38), whereas FIG. 4 shows an overview illustrating the respective quiet zones established by the antennas of the antenna device 18, namely the center antenna 20 and the antenna elements 22, for example the dual-polarized antenna units 48 comprising two antenna elements 22 intersecting each other in a perpendicular manner.

The center antenna 20 as well as the dual-polarized antenna units 48, namely the perpendicularly orientated pairs of antenna elements 22, each generate a certain quiet zone labelled by 0-4 in FIG. 4.

As shown in FIG. 4, the center antenna 20 generates a main quiet zone indicated by 0 and illustrated by a dashed line that has a certain space. The space associated with the main quiet zone is larger than the space provided by the individual antenna elements 22, for example the antenna units 48, the quiet zones of which are indicated by the numbers 1-4.

In some embodiments, the separate quiet zones 1-4 provided by the antenna elements 22, for example the antenna units 48, together form a combined space that (substantially) equals the space of the main quiet zone indicated by 0. In other words, the size of the main quiet zone generated by the center antenna 20 and the size of the sum of the quiet zones generated by the antenna elements 22, for example the antenna units 48, are equal.

Generally, the respective quiet zones 1-4 provided by the antenna elements 22, for example the antenna units 48, are (mostly) located within the main quiet zone that is generated by the center antenna 20.

Furthermore, FIG. 4 reveals that the quiet zones 1-4 provided by the antenna elements 22 may have a different power. Hence, the individual antenna elements 22, for example the antenna units 48, may be controlled by the signal generation and/or analysis equipment 28 such that the power associated with the different quiet zones 1-4 differs in the individual quiet zones 1-4 generated.

In FIG. 5, another embodiment of the antenna device 18 is shown that can be used by the over-the-air test system 10. The antenna device 18 also comprises the center antenna 20 as well as two X-shaped antenna units 48, each comprising two antenna elements 22 orientated perpendicular with respect to each other. Again, the antenna elements 22 are symmetrically located around the center antenna 20.

FIG. 6 shows that the quiet zones generated by the antenna elements 22, for example the X-shaped antenna units 48, and indicated by 1-2 in FIG. 6 together form a combined space that substantially equals the space of the main quiet zone indicated by 0 in FIG. 6, which is generated by the center antenna 20 as already described above.

In some embodiments, the antenna device 18 shown in FIG. 5 differs from the one shown in FIG. 3 in that less antenna elements 22 are provided. However, the antenna elements 22 can generally be grouped in at least two different antenna groups 50, 52 that are associated with different lateral sides of the center antenna 20 in a front view on the center antenna 20.

In FIG. 3, the first antenna group 50 comprises four antenna elements 22, establishing two X-shaped antenna units 48, which are assigned to a left side of the center antenna 20 (in a front view on the center antenna 20), whereas the second antenna group 52 also comprises four antenna elements 22, establishing two X-shaped antenna units 48, that are assigned to the right side of the center antenna 20.

In some embodiments, a vertical symmetry axis S is provided as indicated in FIG. 3 that runs vertically through the center antenna 20, for example its center.

In FIG. 5, the antenna device 18 comprises two antenna elements 22 on each of its different sides, thereby also establishing the two antenna groups 50, 52.

Generally, it is ensured that the antenna elements 22 that are differently established compared to the center antenna 20 are located and/or orientated with respect to the center antenna 20 in a defined manner, thereby ensuring that the quiet zones generated by the antenna elements 22 superimpose with the main quiet zone generated by the center antenna 20 as shown in FIGS. 4 and 6.

The main quiet zone established by the in-band antenna, namely the center antenna 20, has the largest size/space, whereas the separate or rather individual quiet zones generated by the antenna elements 22 fall within this space provided by the main quiet zone. The quiet zones generated by the antenna elements 22 together have a combined size/space that (substantially) equals the one of the main quiet zone as shown in FIGS. 4 and 6.

Therefore, appropriate testing of the device under test 12 located on the testing location 16 can be ensured, for example in-band measurements as well as out-of-band measurements. For this purpose, the antennas, namely the antenna elements 22 and/or the center antenna 20, are controlled appropriately by means of the signal generation and/or analysis equipment 28.

When testing the device under test 12, the individual antennas 22 may be controlled in a combined manner or in a subsequent manner, for example with different powers. Hence, different test scenarios can be used for performing the respective testing of the device under test 12.

Generally, the antennas, namely the antenna elements 22 and/or the center antenna 20, are controlled with regard to their operational frequency range(s) such that the operational frequency range of the center antenna 20 is either a subset of the operational frequency range of the antenna elements 22 or the operational frequency range of the center antenna 20 relates to a different frequency band compared with the antenna elements 22. Hence, the respective testing of the device under test 12 can be performed accurately.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An over-the-air test system for testing a device under test over-the-air, wherein the over-the-air test system comprises a reflector with a focal point, one center antenna and antenna elements, wherein the center antenna is orientated towards the focal point of the reflector, wherein the antenna elements are symmetrically located around the center antenna, and wherein an operational frequency range of the center antenna is different to an operational frequency range of the antenna elements.

2. The over-the-air test system according to claim 1, wherein the operational frequency range of the center antenna is either a subset of the operational frequency range of the antenna elements or the operational frequency range of the center antenna relates to a different frequency band compared with the antenna elements.

3. The over-the-air test system according to claim 1, wherein the antenna elements are grouped in at least two different antenna groups, wherein each antenna group, in a front view on the center antenna, is assigned to one side of the center antenna.

4. The over-the-air test system according to claim 1, wherein the antenna elements are located and/or orientated such that the antenna elements each generate a respective quiet zone, and wherein the respective quiet zone is mostly located within a main quiet zone generated by the center antenna.

5. The over-the-air test system according to claim 4, wherein the quiet zones generated by the antenna elements together cover a combined space that substantially equals the space of the main quiet zone generated by the center antenna.

6. The over-the-air test system according to claim 1, wherein the center antenna and the antenna elements are different from each other and/or wherein the center antenna is a horn antenna.

7. The over-the-air test system according to claim 1, wherein the antenna elements are each identical.

8. The over-the-air test system according to claim 1, wherein the center antenna is a narrow band antenna and/or wherein the antenna elements are wideband antennas that each have a bandwidth larger than the center antenna.

9. The over-the-air test system according to claim 1, wherein the center antenna has a frequency range from 24 to 43 GHz.

10. The over-the-air test system according to claim 1, wherein the antenna elements are established by Vivaldi antennas.

11. The over-the-air test system according to claim 1, wherein two antenna elements are orientated perpendicularly with respect to each other, thereby establishing a dual-polarized antenna unit.

12. The over-the-air test system according to claim 1, wherein the over-the-air test system has an antenna device that comprises the center antenna and the antenna elements, wherein the antenna device has a main body to which the center antenna is connected, and wherein the antenna elements are located at arms that extend away from the main body.

13. The over-the-air test system according to claim 12, wherein the main body is configured to be tilted with respect to a horizontal plane such that the main body is enabled to adjust elevation.

14. The over-the-air test system according to claim 13, wherein the main body comprises at least two parts movable with respect to each other, thereby ensuring the adjustment of elevation.

15. The over-the-air test system according to claim 12, wherein each arm provided is associated with at least one corresponding cable guide that guides a cable to the antenna element provided at the respective arm, and wherein the cable guides each comprise a curved section providing a curvature for the cable and/or a hole in the cable guide, wherein the hole is located between the curved section and an attachment point at which the cable guide is attached to the arm.

16. The over-the-air test system according to claim 15, wherein the cable guide is swivably attached to the main body.

17. The over-the-air test system according to claim 1, wherein the over-the-air test system comprises a test chamber encompassing a test location for the device under test and/or a signal generation and/or analysis equipment.

18. A method of performing an over-the-air measurement of a device under test by using an over-the-air test system, wherein the method comprises:
    providing an over-the-air test system that comprises a reflector with a focal point, one center antenna and antenna elements, wherein the center antenna is orientated towards the focal point of the reflector;
    generating a main quiet zone by means of the center antenna using a first operational frequency range; and
    generating at least one quiet zone by means of the antenna elements using a second operational frequency range, wherein the second operational frequency range is different to the first operational frequency range of the center antenna.

19. The method according to claim 18, wherein the antenna elements are controlled such that a sequential measurement or a combined measurement is performed.

20. The method according to claim 19, wherein separate quiet zones are generated by the antenna elements, and wherein one of the separate quiet zones has a higher power than at least one other of the separate quiet zones when performing the combined measurement.

* * * * *